United States Patent
Nobori et al.

(10) Patent No.: US 11,685,077 B2
(45) Date of Patent: Jun. 27, 2023

(54) METHOD OF MANUFACTURING WAFER MOUNTING TABLE

(71) Applicant: NGK INSULATORS, LTD., Nagoya (JP)

(72) Inventors: Kazuhiro Nobori, Nagoya (JP); Takuji Kimura, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 108 days.

(21) Appl. No.: 17/019,745

(22) Filed: Sep. 14, 2020

(65) Prior Publication Data

US 2020/0406499 A1 Dec. 31, 2020

Related U.S. Application Data

(63) Continuation of application No. PCT/JP2019/035481, filed on Sep. 10, 2019.

(30) Foreign Application Priority Data

Sep. 27, 2018 (JP) .................................. 2018-181174

(51) Int. Cl.
*B28B 23/02* (2006.01)
*B28B 1/14* (2006.01)
(Continued)

(52) U.S. Cl.
CPC ................ *B28B 23/02* (2013.01); *B28B 1/14* (2013.01); *B28B 3/00* (2013.01); *B28B 11/243* (2013.01);
(Continued)

(58) Field of Classification Search
CPC ............. H01L 21/683; H01L 21/02304; H01L 21/02362; H01L 21/68757;
(Continued)

(56) References Cited

U.S. PATENT DOCUMENTS

| 5,800,618 A | 9/1998 | Niori et al. |
| 2012/0248716 A1* | 10/2012 | Nobori ................... B32B 18/00 |
| | | 156/89.12 |

(Continued)

FOREIGN PATENT DOCUMENTS

| CN | 102731072 A | 10/2012 |
| JP | H07-273164 A1 | 10/1995 |

(Continued)

OTHER PUBLICATIONS

Machine English trasnlation of Arita et al. JP-2003040690-A (Year: 2003).*

(Continued)

*Primary Examiner* — Francisco W Tschen
*Assistant Examiner* — Edgaredmanuel Troche
(74) *Attorney, Agent, or Firm* — Burr Patent Law, PLLC

(57) ABSTRACT

A method of manufacturing a wafer mounting table according to an embodiment includes: (a) a step of loading a ceramic slurry containing a ceramic powder and a gelling agent into opening portions of a metal mesh, inducing a chemical reaction of the gelling agent to gelate the ceramic slurry, and then performing degreasing and calcining to prepare a ceramic-loaded mesh; (b) a step of sandwiching the ceramic-loaded mesh between a first ceramic calcined body and a second ceramic calcined body obtained by calcining after mold cast forming so as to prepare a multilayer body; and (c) a step of hot press firing the multilayer body to prepare the wafer-receiving table.

4 Claims, 6 Drawing Sheets

(51) Int. Cl.
   *B28B 3/00*     (2006.01)
   *B28B 11/24*    (2006.01)
   *H01J 37/32*    (2006.01)
   *H01L 21/67*    (2006.01)
   *H01L 21/683*   (2006.01)

(52) U.S. Cl.
   CPC ... *H01J 37/32724* (2013.01); *H01L 21/67103* (2013.01); *H01L 21/6831* (2013.01)

(58) Field of Classification Search
   CPC ..... H01L 2224/05187; H01L 21/67144; H01L 21/563; H01L 2021/6027; H01L 23/12; H01L 23/40; H01L 23/49537; H01L 23/49805; C04B 35/624; C04B 35/645; C04B 35/111; B28B 23/02; B28B 1/14; B28B 3/00; B28B 11/243; B28B 1/002; B28B 3/025; B28B 11/00; C23C 6/00
   USPC ....................................................... 264/259
   See application file for complete search history.

(56) References Cited

U.S. PATENT DOCUMENTS

2012/0250212 A1* 10/2012 Kimura ............... C04B 35/5626
                                                    156/89.12
2016/0280604 A1*  9/2016 Nobori ............. C04B 35/62685

FOREIGN PATENT DOCUMENTS

JP    H11-228244 A1    8/1999
JP    2003040690 A  *  2/2003
JP    2012-209499 A1  10/2012

OTHER PUBLICATIONS

International Search Report and Written Opinion (Application No. PCT/JP2019/035481) dated Dec. 10, 2019.
English translation of the International Preliminary Report on Patentability (Chapter I) (Application No. PCT/JP2019/035481) dated Apr. 8, 2021.

* cited by examiner

METHOD OF MANUFACTURING WAFER MOUNTING TABLE

BACKGROUND OF THE INVENTION

1. Field of the Invention

The present invention relates to a method of manufacturing a wafer mounting table.

2. Description of the Related Art

There is known a wafer mounting table constituted by a ceramic plate and a metal mesh (electrode) built into the ceramic plate. As described in PTL 1, there is known a method of manufacturing a wafer mounting table that involves placing a metal mesh on a surface of a ceramic raw material molded body, loading ceramic raw material granules onto the metal mesh, and performing press forming to prepare a multilayer body, and hot press firing the multilayer body.

CITATION LIST

Patent Literature

[PTL 1] JP 11-228244 A

SUMMARY OF THE INVENTION

However, in the production method described above, granules migrate from a high loading density region to a low loading density region during press forming of the granules, and thus there frequently arises a problem of positional displacement of the metal mesh. In order to prevent positional displacement, the inventors of the present invention have studied a production method that involves firing a metal mesh sandwiched between two ceramic calcined bodies obtained by calcining after mold cast forming, although this is not a known art. When this production method was actually used to produce a wafer mounting table, positional displacement of the metal mesh could be prevented, but there arose a new problem of separation at the interface between the metal mesh and the sintered body.

The present invention has been made to address this problem, and a main object thereof is to prevent positional displacement of the metal mesh and prevent the interfacial separation between the metal mesh and the sintered body.

A method of manufacturing a wafer mounting table of the present invention includes:
(a) a step of loading a ceramic slurry containing a ceramic powder and a gelling agent into opening portions of a metal mesh, inducing a chemical reaction of the gelling agent to gelate the ceramic slurry, and then performing degreasing and calcining to prepare a ceramic-loaded mesh;
(b) a step of sandwiching the ceramic-loaded mesh between a first ceramic calcined body and a second ceramic calcined body obtained by calcining after mold cast forming so as to prepare a multilayer body; and
(c) a step of hot press firing the multilayer body to prepare a wafer mounting table.

According to this method of manufacturing a wafer mounting table, positional displacement of the metal mesh can be prevented, and interfacial separation between the metal mesh and the sintered body can be prevented. Specifically, the multilayer body is obtained by sandwiching the ceramic-loaded mesh between the first and second ceramic calcined bodies. Since the first and second ceramic calcined bodies obtained by calcining after mold cast forming have homogeneous densities, the positional displacement of the mesh can be prevented. In addition, since the ceramic calcined body is loaded into the opening portions of the metal mesh before performing hot press firing in the step (c), no voids remain in the opening portions of the metal mesh during hot press firing. Thus, occurrence of separation at the interface between the metal mesh and the sintered body after hot press firing can be prevented.

Mold cast forming refers to a method that involves preparing a mold (an upper mold piece and a lower mold piece) having a mold cavity having the same shape as the shape of an end product, pouring a ceramic slurry into the mold cavity, solidifying the ceramic slurry, and opening the mold to obtain a ceramic molded body having the same shape as the end product.

In order to load the ceramic slurry into the opening portions of the metal mesh in the step (a) of the method of manufacturing a wafer mounting table of the present invention, the metal mesh may be placed inside a mold, and the ceramic slurry may be poured into the mold while the upper mold piece and the lower mold piece are in close contact with the metal mesh. In this manner, variation in thickness of the ceramic-loaded mesh can be suppressed.

In this case, in pouring the ceramic slurry into the mold in the step (a), the pressure of the inside of the mold may be decreased to be lower than the atmospheric pressure, and then the ceramic slurry may be poured. In this manner, incorporation of air bubbles into the ceramic slurry can be prevented.

In order to load the ceramic slurry into the opening portions of the metal mesh in the step (a) of the method of manufacturing a wafer mounting table of the present invention, the metal mesh may be dipped in a container containing the ceramic slurry. In this manner also, the ceramic slurry can be loaded into the opening portions of the metal mesh.

DETAILED DESCRIPTION OF THE INVENTION

Figure 1A:
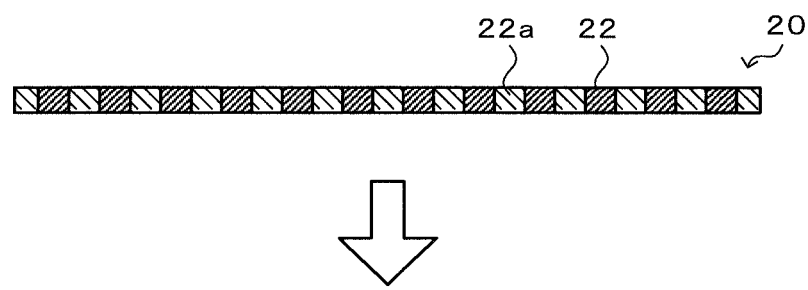
FIGS. 1A to 1C are diagrams illustrating steps of producing a wafer mounting table 10.
Figure 1B:
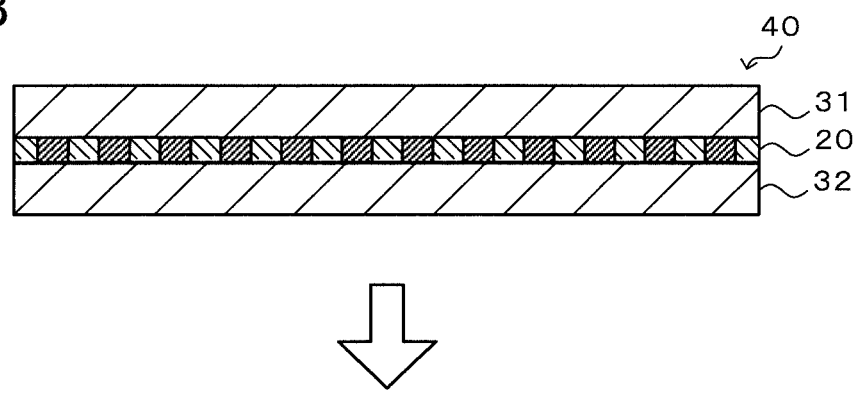
Figure 1C:
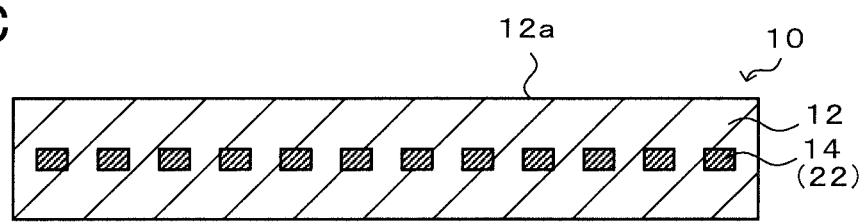
Figure 2:
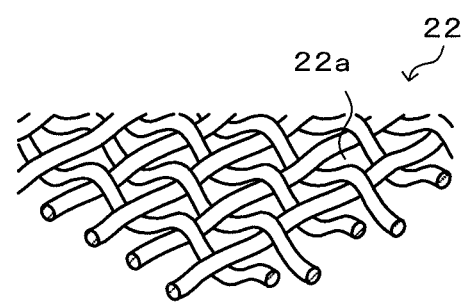
FIG. 2 is a perspective view of a part of a metal mesh 22.
Figure 3:
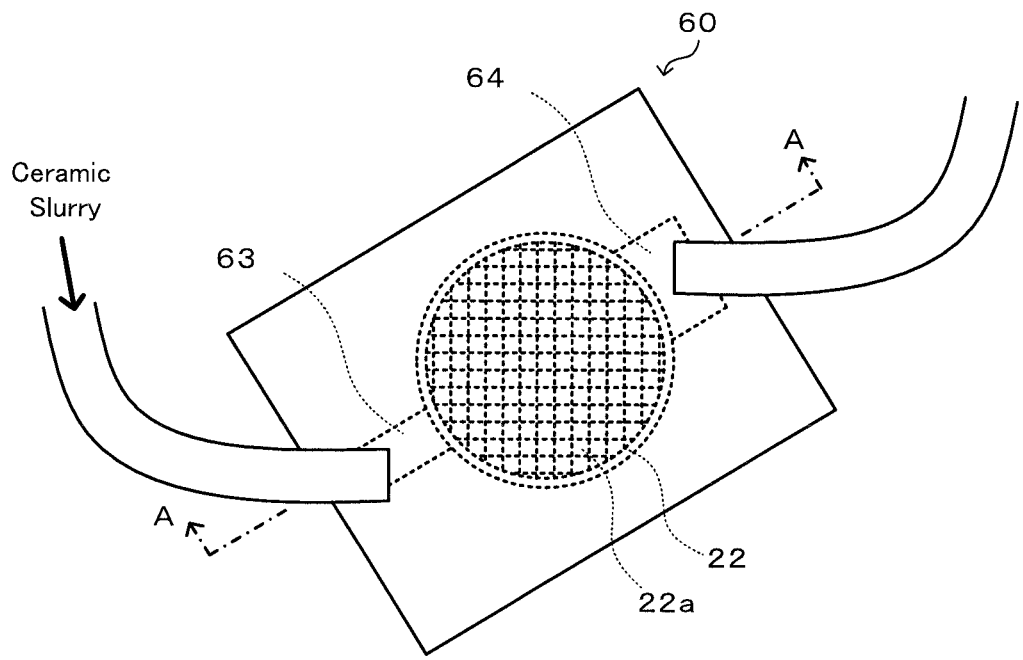
FIG. 3 is a plan view of a mold 60.
Figure 4:
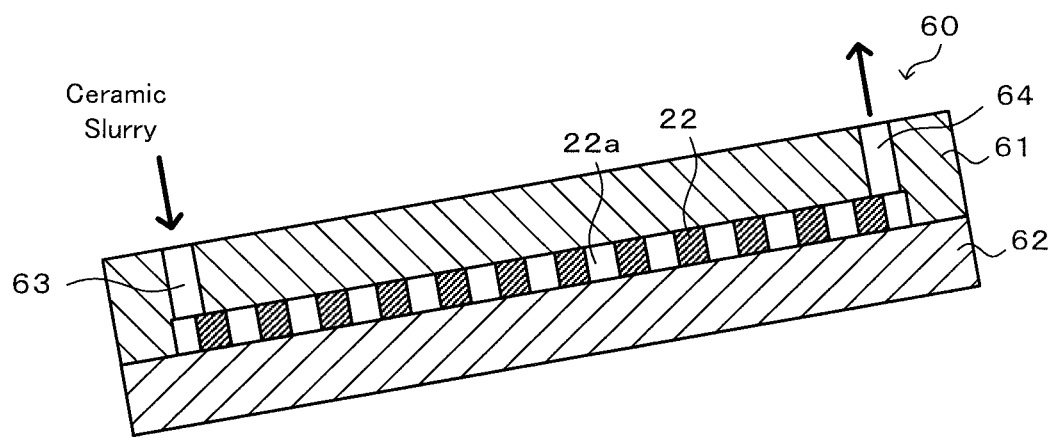
FIG. 4 is a cross-sectional view taken at A-A in FIG. 3.
Figure 5:
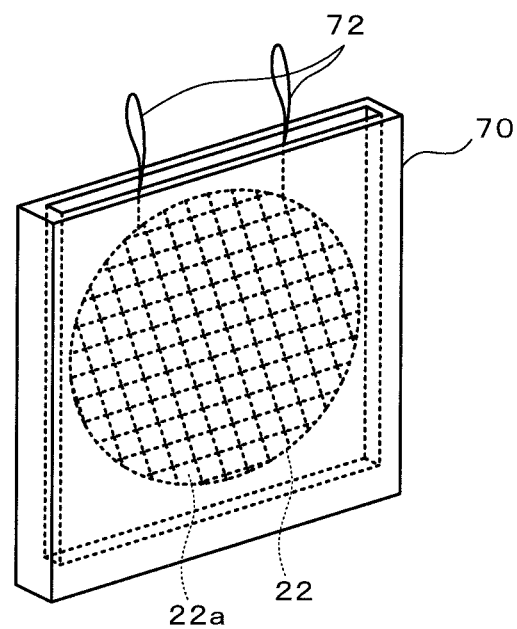
FIG. 5 is a perspective view of a container 70.

Preferred embodiments of the present invention will now be described with reference to the drawings. FIGS. 1A to 1C are diagrams illustrating steps of producing a wafer mounting table 10, FIG. 2 is a perspective view of a part of a metal mesh 22, FIG. 3 is a plan view of a mold 60, FIG. 4 is a cross-sectional view taken at A-A in FIG. 3, and FIG. 5 is a perspective view of a container 70.

As illustrated in FIGS. 1A to 1C, the method for producing the wafer mounting table 10 according to this embodiment includes: (a) a step of loading a ceramic slurry containing a ceramic powder and a gelling agent into opening portions 22a of a metal mesh 22, inducing a chemical reaction of the gelling agent to gelate the ceramic slurry, and then performing degreasing and calcining to prepare a ceramic-loaded mesh 20 (refer to FIG. 1A); (b) a step of sandwiching the ceramic-loaded mesh 20 between a first ceramic calcined body 31 and a second ceramic calcined body 32 so as to prepare a multilayer body 40 (refer to FIG. 1B); and (c) a step of hot press firing the multilayer body 40 to prepare the wafer mounting table 10 (refer to FIG. 1C).

Step (a)

In the step (a), a ceramic slurry containing a ceramic powder and a gelling agent is used. The ceramic slurry typically contains a solvent and a dispersing agent in addition to the ceramic powder and the gelling agent.

The raw material for the ceramic powder may be an oxide-based ceramic or a non-oxide-based ceramic. Examples thereof include alumina, yttria, aluminum nitride, silicon nitride, silicon carbide, samaria, magnesia, magnesium fluoride, and ytterbium oxide. These materials may be used alone or in combination of two or more. The ceramic powder may have any average particle diameter as long as a homogeneous ceramic slurry can be prepared or produced, and the average particle diameter is preferably 0.4 to 0.6 µm and more preferably 0.45 to 0.55 µm.

The gelling agent may contain, for example, an isocyanate, a polyol, and a catalyst, or an isocyanate, water, and a catalyst. Among these, the isocyanate is not particularly limited as long as it is a substance that has an isocyanate group as a functional group, and examples thereof include tolylene diisocyanate (TDI), diphenylmethane diisocyanate (MDI), and modified products thereof. The molecule may contain a reactive functional group other than the isocyanate group, and may contain a large number of reactive functional groups as in polyisocyanates. The polyol is not particularly limited as long as it is a substance that has two or more hydroxyl groups that can react with the isocyanate group, and examples thereof include ethylene glycol (EG), polyethylene glycol (PEG), propylene glycol (PG), polypropylene glycol (PPG), polytetramethylene glycol (PTMG), polyhexamethylene glycol (PHMG), and polyvinyl alcohol (PVA). The catalyst is not particularly limited as long as it is a substance that can accelerate the urethane reaction of the isocyanate and the polyol, and examples thereof include triethylenediamine, hexanediamine, and 6-dimethylamino-1-hexanol.

The solvent (also referred to as a dispersing medium) is not particularly limited as long as it is a substance that dissolves the dispersing agent and the gelling agent, and examples thereof include hydrocarbon-based solvents (toluene, xylene, solvent naphtha, etc.), ether-based solvents (ethylene glycol monoethyl ether, butyl carbitol, butyl carbitol acetate, etc.), alcohol-based solvents (isopropanol, 1-butanol, ethanol, 2-ethyl hexanol, terpineol, ethylene glycol, glycerin, etc.), ketone-based solvents (acetone, methyl ethyl ketone, etc.), ester-based solvents (butyl acetate, dimethyl glutarate, triacetin, etc.), and polybasic acid-based solvents (glutaric acid, etc.). In particular, a solvent having two or more ester bonds, such as a polybasic acid ester (for example, dimethyl glutarate) or an acid ester of a polyhydric alcohol (for example, triacetin), is preferably used.

The dispersing agent is not particularly limited as long as it homogeneously disperses the ceramic powder in the solvent. Examples thereof include polycarboxylic acid-based copolymers, polycarboxylates, sorbitan fatty acid esters, polyglycerin fatty acid esters, phosphate ester-based copolymers, sulfonate-based copolymers, and polyurethane polyester-based copolymers having tertiary amine. In particular, polycarboxylic acid-based copolymers and polycarboxylates are preferable for the use. Adding this dispersing agent can decrease the viscosity of and increase the fluidity of the slurry before the forming.

The ceramic slurry is preferably prepared by adding a solvent and a dispersing agent to a ceramic powder at particular ratios, mixing the resulting mixture for a particular time to prepare a slurry precursor, then adding a gelling agent to the slurry precursor, and mixing and vacuum degassing the resulting mixture. The mixing method employed in preparing the slurry precursor and the slurry is not particularly limited, and, for example, a ball mill, planetary mixing, vibration mixing, or propeller mixing can be employed. The ceramic slurry containing the slurry precursor and the gelling agent is preferably immediately poured into a mold or a container since the chemical reaction (urethane reaction) of the gelling agent will start to proceed with the passage of time.

In the step (a), the ceramic slurry is loaded into the opening portions 22a of the round metal mesh 22 illustrated in FIG. 2, and the chemical reaction of the gelling agent is induced to gelate the ceramic slurry. The material for the metal mesh 22 is not particularly limited, and examples thereof include refractory metals such as tungsten, molybdenum, and titanium. The wire diameter and mesh size of the metal mesh 22 are not particularly limited, but are preferably, respectively, 0.05 mm or more and 0.8 mm or less and 10 or more and 80 or less per inch. The ceramic slurry is gelated by the chemical reaction of the gelling agent in the slurry. The chemical reaction of the gelling agent is a reaction in which an isocyanate and a polyol (or water) undergo a urethane reaction to form a urethane resin (polyurethane). The ceramic slurry is gelated by the reaction of the gelling agent, and the urethane resin functions as an organic binder.

In the step (a), after the ceramic slurry loaded into the opening portions 22a of the metal mesh 22 is gelated, drying, degreasing, and calcining are performed to prepare a ceramic-loaded mesh 20. Drying is performed to evaporate the solvent contained in the gel. The drying temperature and the drying time may be appropriately set according to the solvent to be used. However, the drying temperature is carefully set so that the object to be dried does not crack. The atmosphere may be an air atmosphere, an inert atmosphere, or a vacuum atmosphere. The dimensions decrease by about a few percent in the line direction as a result of drying. Degreasing is performed to decompose and remove organic matter, such as a dispersing agent and a catalyst. The degreasing temperature may be appropriately set according to the type of the organic matter contained. The atmosphere may be an air atmosphere, an inert atmosphere, or a vacuum atmosphere. Calcining is performed to increase strength and facilitate handling. The calcining temperature may be appropriately set according to the type of the ceramic powder contained. The atmosphere may be an air atmosphere, an inert atmosphere, or a vacuum atmosphere. The dimensions decrease by about a few percent in the line direction as a result of calcining.

As illustrated in FIGS. 3 and 4, in order to load the ceramic slurry into the opening portions 22a of the metal mesh 22 in the step (a), the metal mesh 22 may be placed inside a mold 60, and the ceramic slurry may be poured into the mold 60 through a slurry inlet port 63 while an upper mold piece 61 and a lower mold piece 62 are in close contact with the metal mesh 22. In this manner, variation in thickness of the ceramic-loaded mesh 20 can be suppressed. Here, as illustrated in FIG. 4, the slurry inlet port 63 of the mold 60 is obliquely arranged so that the slurry inlet port 63 is lower than the slurry outlet port 64. In this manner, the air bubbles in the ceramic slurry are easily discharged through the slurry outlet port 64. In addition, in pouring the ceramic slurry into the mold 60, the pressure of the inside of the mold 60 is decreased to be lower than the atmospheric pressure, and then the ceramic slurry is poured. In this manner, incorporation of air bubbles into the ceramic slurry can be prevented.

As illustrated in FIG. 5, in order to load the ceramic slurry into the opening portions 22a of the metal mesh 22 in the step (a), the ceramic slurry may be placed inside a flat container 70 having an opening in the upper portion, and the metal mesh 22 may be dipped therein. After loading, the metal mesh 22 may be lifted upward by a lift 72 and removed from the container 70. In this manner also, the ceramic slurry can be loaded into the opening portions 22a of the metal mesh 22. However, according to this method, the thickness as a whole is not always even. Thus, the method illustrated in FIGS. 3 and 4, which rarely has such a problem, is preferable.

Step (b)

In the step (b), the ceramic-loaded mesh 20 is sandwiched between disk-shaped first and second ceramic calcined bodies 31 and 32 to prepare a multilayer body 40 (refer to FIG. 1B). The first and second ceramic calcined bodies 31 and 32 are, for example, prepared by drying, degreasing, and calcining molded bodies prepared by mold cast forming the ceramic slurry described above. In this manner, positional displacement of the ceramic-loaded mesh 20 can be prevented. In preparing the multilayer body 40, the first ceramic calcined body 31, the second ceramic calcined body 32, and the ceramic-loaded mesh 20 are aligned as needed.

Step (c)

In the step (c), the multilayer body 40 is hot press fired to prepare a wafer mounting table 10. In hot press firing, for example, the pressing pressure is preferably 30 to 300 kgf/cm$^2$ and more preferably 50 to 250 kgf/cm$^2$ at a highest temperature (firing temperature) although this is not limiting. The highest temperature may be appropriately set according to the type and particle diameter of the ceramic powder, etc., and is preferably set within the range of 1000 to 2000° C. The atmosphere may be appropriately selected from an air atmosphere, an inert atmosphere (for example, a nitrogen atmosphere), and a vacuum atmosphere according to the type of the ceramic powder. The dimensions decrease by about 50% in the thickness direction as a result of hot press firing.

The wafer mounting table 10 is a disk-shaped ceramic plate 12 having a round electrode 14 (metal mesh 22) built into the ceramic plate 12, and an upper surface of the ceramic plate 12 serves as a wafer mounting surface 12a. The ceramic plate 12 is a monolithic sinter obtained by sintering the first and second ceramic calcined bodies 31 and 32 and the ceramic calcined body contained in the ceramic-loaded mesh 20. The electrode 14 of the wafer mounting table 10 can be used as an electrostatic electrode. In such a case, when a DC voltage is applied to the electrode 14 of the wafer mounting table 10, the wafer is adsorbed and fixed to the wafer mounting surface 12a by an electrostatic attraction force, and when application of the DC voltage is stopped, the wafer is no longer adsorbed or fixed to the wafer mounting surface 12a. Alternatively, the electrode 14 may be used as an RF electrode. In such a case, an upper electrode parallel to the wafer mounting surface 12a is placed above the wafer mounting surface 12a on which the wafer is placed, and in the presence of a process gas, high frequency power is supplied from the RF power source to the electrode 14. In this manner, a plasma is generated between parallel plate electrodes, i.e., the upper electrode and the electrode 14, and thus CVD film deposition and/or etching can be performed on the wafer by using this plasma. Alternatively, the electrode 14 may be used as an electrode that serves as both an electrostatic electrode and an RF electrode.

According to the method of manufacturing the wafer mounting table 10 described in detail above, positional displacement of the electrode 14 (metal mesh 22) in the ceramic plate 12 can be prevented, and interfacial separation between the electrode 14 and the ceramic plate 12 can be prevented. Specifically, the multilayer body 40 is obtained by sandwiching the ceramic-loaded mesh 20 between the first and second ceramic calcined bodies 31 and 32, and since no powder or granules are present around the ceramic-loaded mesh 20, positional displacement of the mesh 20 can be prevented. In addition, since the ceramic calcined body is loaded into the opening portions 22a of the metal mesh 22 before performing hot press firing in the step (c), no voids remain in the opening portions 22a of the metal mesh 22 during hot press firing. Thus, occurrence of separation at the interface between the electrode 14 and the ceramic plate 12 after hot press firing can be prevented.

In addition, in the step (a), when the ceramic slurry is loaded into the opening portions 22a of the metal mesh 22 by pouring the ceramic slurry into the mold 60 through the slurry inlet port 63 while the metal mesh 22 placed in the mold 60 is in close contact with the upper mold piece 61 and the lower mold piece 62, variation in thickness of the ceramic-loaded mesh 20 can be suppressed. In this case, the pressure of the inside of the mold 60 may be decreased to be lower than the atmospheric pressure, and then the ceramic slurry may be poured. In this manner, incorporation of air bubbles into the ceramic slurry can be prevented.

Furthermore, in the step (a), the metal mesh 22 may be dipped into the container 70 containing the ceramic slurry so as to load the ceramic slurry into the opening portions 22a of the metal mesh 22.

The present invention is not limited to the embodiments described above, and can naturally be implemented in various forms without departing from the technical scope of the present invention.

Figure 6A:
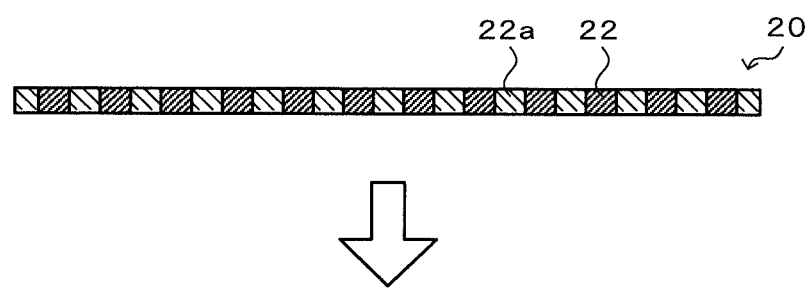
FIGS. 6A to 6C are diagrams illustrating steps of producing a wafer mounting table 110.
Figure 6B:
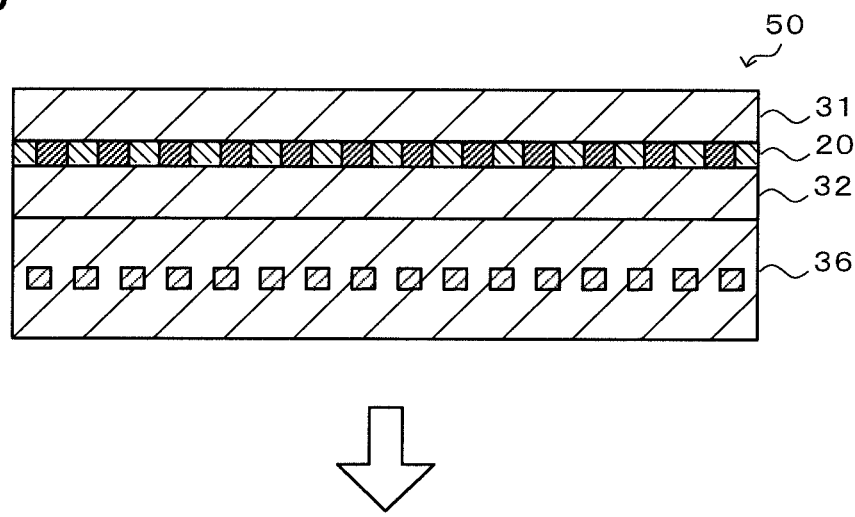
Figure 6C:
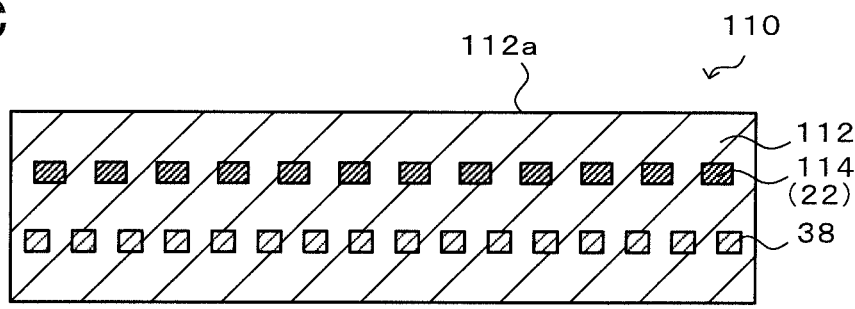

For example, in the embodiments described above, the wafer mounting table 10 is produced; alternatively, a wafer mounting table 110 illustrated in FIGS. 6A to 6C may be produced. That is, first, a ceramic-loaded mesh 20 is prepared as in the embodiments described above (refer to FIG. 6A). Next, the ceramic-loaded mesh 20 is sandwiched between a first ceramic calcined body 31 and a second ceramic calcined body 32, and a third ceramic calcined body 36 having a heater electrode 38 built therein is stacked to prepare a multilayer body 50 (refer to FIG. 6B). The heater electrode 38 is a coil wire laid out in a unicursal manner throughout the entire surface of the third ceramic calcined body 36. Alternatively, the entire surface of the third ceramic calcined body 36 may be divided into two or more zones, and one heater electrode may be provided for each zone. Next, the multilayer body 50 is hot press fired to prepare a wafer mounting table 110 (refer to FIG. 6C). The wafer mounting table 110 is a disk-shaped ceramic plate 112 having a round electrode 114 (metal mesh 22) and a heater electrode 38 built in the ceramic plate 112, and an upper surface of the ceramic plate 112 serves as a wafer mounting surface 112a. The ceramic plate 112 is a monolithic sinter obtained by sintering the first to third ceramic calcined bodies 31, 32, and 36, and the ceramic calcined body contained in the ceramic-loaded mesh 20. According to this wafer mounting table 110, when power is supplied to the heater electrode 38 while a wafer is on the wafer mounting surface 112a, the heater electrode 38 generates heat and heats the wafer. As with the electrode 14 described above, the electrode 114 can also be used as one or both of an electrostatic electrode and a RF electrode.

In the embodiment described above, a hollow ceramic shaft may be attached to the back surface of the wafer mounting table 10. A hollow ceramic shaft may be attached to the back surface of the wafer mounting table 110.

Figure 7A:
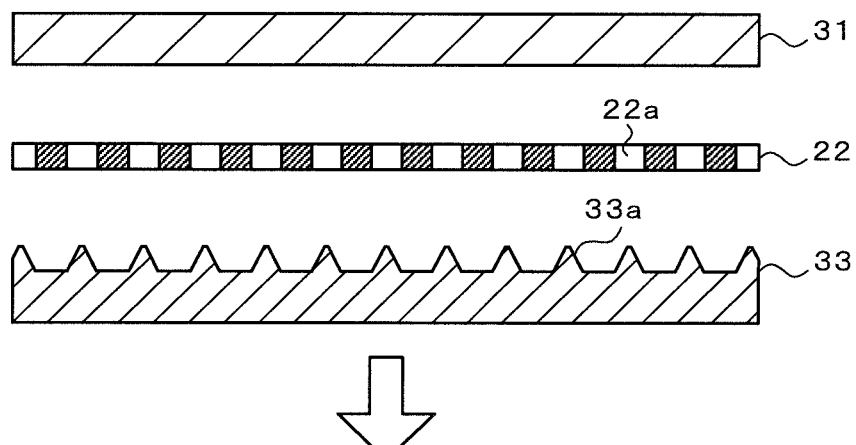
FIGS. 7A to 7C are diagrams illustrating a reference example of steps of producing the wafer mounting table 10.
Figure 7B:
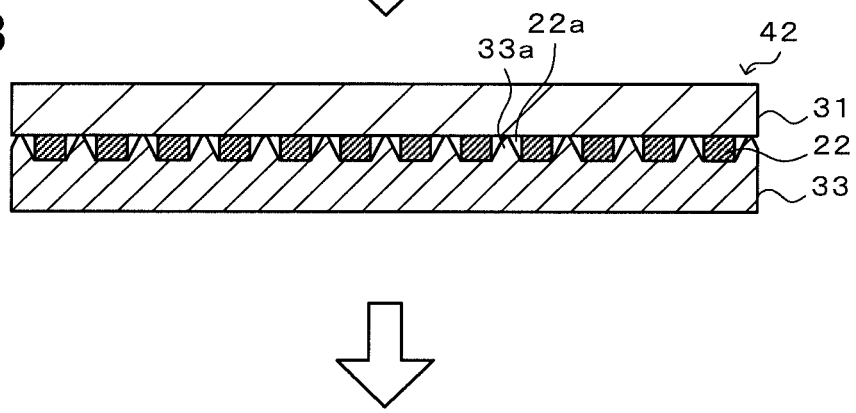
Figure 7C:
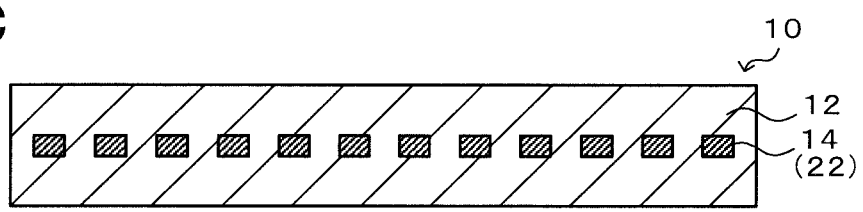

Instead of the method of manufacturing a wafer mounting table of the present invention, the following production method may be employed. That is, in a method of manufacturing a wafer mounting table that involves preparing a multilayer body by sandwiching a metal mesh between a first ceramic calcined body and a second ceramic calcined body and hot press firing the multilayer body, the second ceramic calcined body may have protrusions on a surface that comes into contact with the metal mesh, the protrusions respectively corresponding to opening portions of the metal mesh, so that the protrusions of the second ceramic calcined body respectively fit into the opening portions of the metal mesh when the multilayer body is prepared. Specifically, as illustrated in FIGS. 7A to 7C, first, a disk-shaped first ceramic calcined body 31, a round metal mesh 22, and a disk-shaped second ceramic calcined body 33 are prepared (refer to FIG. 7A). Conical protrusions 33a that penetrate into the respective opening portions 22a of the metal mesh 22 are formed on the upper surface of the second ceramic calcined body 33. Next, the metal mesh 22 is sandwiched between the first and second ceramic calcined bodies 31 and 33 to prepare a multilayer body 42 (refer to FIG. 7B). In preparing the multilayer body 42, the protrusions 33a of the second ceramic calcined body 33 are arranged to penetrate into the respective opening portions 22a of the metal mesh 22. Next, the multilayer body 42 is hot press fired to prepare a wafer mounting table 10 (refer to FIG. 7C). The wafer mounting table 10 is a disk-shaped ceramic plate 12 having a round electrode 14 (metal mesh 22) built into the ceramic plate 12. In this manner also, positional displacement of the metal mesh 22 can be prevented, and interfacial separation between the metal mesh 22 and the ceramic plate 12 can be prevented.

EXAMPLES

The examples of the present invention will now be described. The examples described below do not limit the present invention in any way.

Example 1

1. Preparation of First and Second Ceramic Calcined Bodies

First, 100 parts by mass of an aluminum nitride powder (purity: 99.7%), 5 parts by mass of yttrium oxide, 2 parts by mass of a dispersing agent (polycarboxylic acid-based copolymer), and 30 parts by mass of a dispersing medium (polybasic acid ester) were mixed in a ball mill (trommel) for 14 hours to obtain a ceramic slurry precursor. To this ceramic slurry precursor, 4.5 parts by mass of an isocyanate (4,4'-diphenylmethane diisocyanate), 0.1 parts by mass of water, and 0.4 parts by mass of a catalyst (6-dimethylamino-1-hexanol) were added, and the resulting mixture was mixed to obtain a ceramic slurry. The ceramic slurry was poured into a mold (a mold for preparing first and second ceramic calcined bodies) having a disk-shaped inner cavity, an organic binder (urethane resin) was generated by the chemical reaction of the isocyanate and water, and then the solidified molded body was removed from the mold. The molded body was dried at 100° C. for 10 hours, and degreased and calcined in a hydrogen atmosphere at a highest temperature of 1300° C. so as to obtain first and second ceramic calcined bodies.

2. Preparation of Ceramic-Loaded Mesh

A ceramic-loaded mesh was prepared by using the mold 60 (refer to FIGS. 3 and 4) described above. The ceramic slurry used was the same as in the section 1 described above. Pouring the ceramic slurry into the mold 60 was performed in vacuum. The conditions for drying, degreasing, and calcining were the same as in the section 1 described above.

3. Preparation of Multilayer Body

The ceramic-loaded mesh was sandwiched between the first and second ceramic calcined bodies to prepare a multilayer body.

4. Preparation of Wafer Mounting Table

The multilayer body was hot press fired in nitrogen gas at a pressing pressure of 250 kgf/cm$^2$ and at 1860° C. for 6 hours to prepare a wafer mounting table.

5. Evaluation

Whether separation occurred at the interface between the metal mesh and the ceramic plate in the obtained wafer mounting table was examined, and no separation was found. Moreover, positional displacement of the metal mesh was not found.

Example 2

A wafer mounting table was prepared as in Example 1 except that the ceramic-loaded mesh was prepared by using the container 70 (refer to FIG. 5) described above. Specifically, the metal mesh was set in the container 70, the ceramic slurry prepared in the section 1 of Example 1 was poured into the container 70 in vacuum, and the vacuum was released as soon as the slurry viscosity reached 7500 cP. The metal mesh was then pulled up and left to stand in air. The conditions for drying, degreasing, and calcining were the same as in the section 1 of Example 1. Whether separation occurred at the interface between the metal mesh and the ceramic plate in the obtained wafer mounting table was examined, and no separation was found. Moreover, positional displacement of the metal mesh was not found.

Reference Example 1

A wafer mounting table was prepared by the method illustrated in FIGS. 7A to 7C. The first and second ceramic calcined bodies 31 and 33 were obtained by preparing molded bodies by using the ceramic slurry prepared in the section 1 of Example 1, and drying, degreasing, and calcining the molded bodies under the conditions indicated in the section 1 of Example 1. Hot press firing was performed under the same conditions as in the section 4 in Example 1. Whether separation occurred at the interface between the metal mesh and the ceramic plate in the obtained wafer mounting table was examined, and no separation was found. Moreover, positional displacement of the metal mesh was not found.

Comparative Example 1

A wafer mounting table was prepared as in Example 1 except that the metal mesh was directly used instead of the ceramic-loaded mesh. Whether separation occurred at the interface between the metal mesh and the ceramic plate in the obtained wafer mounting table was examined, and separation was found. Positional displacement of the metal mesh was not found.

The present application claims priority from Japanese Patent Application No. 2018-181174, filed on Sep. 27, 2018, the entire contents of which are incorporated herein by reference.

What is claimed is:

1. A method of manufacturing a wafer mounting table, the method comprising:
   (a) a step of loading a ceramic slurry containing a ceramic powder and a gelling agent into opening portions of a metal mesh, inducing a chemical reaction of the gelling agent to gelate the ceramic slurry, and then performing degreasing and calcining to prepare a ceramic-loaded mesh;
   (b) a step of sandwiching the ceramic-loaded mesh between, and in direct contact with a first ceramic calcined body and a second ceramic calcined body obtained by calcining after mold cast forming so as to prepare a multilayer body; and
   (c) a step of hot press firing the multilayer body to prepare a wafer-receiving table.

2. The method of manufacturing a wafer mounting table according to claim 1, wherein:
   in the step (a), the metal mesh is placed inside a mold, and the ceramic slurry is poured into the mold while an upper mold piece and a lower mold piece are in close contact with the metal mesh so as to load the ceramic slurry into the opening portions of the metal mesh.

3. The method of manufacturing a wafer mounting table according to claim 2, wherein:
   in the step (a), in pouring the ceramic slurry into the mold, the ceramic slurry is poured after a pressure inside the mold is decreased to be lower than an atmospheric pressure.

4. The method of manufacturing a wafer mounting table according to claim 1, wherein:
   in the step (a), the ceramic slurry is loaded into the opening portions of the metal mesh by dipping the metal mesh in a container containing the ceramic slurry.

* * * * *